US006503843B1

(12) United States Patent
Xia et al.

(10) Patent No.: US 6,503,843 B1
(45) Date of Patent: Jan. 7, 2003

(54) MULTISTEP CHAMBER CLEANING AND FILM DEPOSITION PROCESS USING A REMOTE PLASMA THAT ALSO ENHANCES FILM GAP FILL

(75) Inventors: Li-Qun Xia, San Jose, CA (US); Ellie Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/400,338

(22) Filed: Sep. 21, 1999

(51) Int. Cl.$^7$ ............................................. H01L 21/302
(52) U.S. Cl. ..................... 438/706; 438/710; 438/712; 438/720
(58) Field of Search ................................. 438/706, 710, 438/711, 712, 720, 778, 787, 785; 134/1.1, 1.2, 2

(56) References Cited

U.S. PATENT DOCUMENTS

| | | | |
|---|---|---|---|
| 4,892,753 A | 1/1990 | Wang et al. .................. 427/38 |
| 4,960,488 A * | 10/1990 | Law et al. ................... 156/345 |
| 5,013,691 A | 5/1991 | Lory et al. ................... 437/238 |
| 5,089,442 A | 2/1992 | Olmer ........................ 432/235 |
| 5,279,865 A | 1/1994 | Chebi et al. ................. 427/574 |
| 5,302,233 A | 4/1994 | Kim et al. ................... 156/636 |
| 5,403,630 A * | 4/1995 | Matsui et al. ................ 427/583 |
| 5,416,048 A | 5/1995 | Blalock et al. ............. 437/228 |
| 5,591,302 A * | 1/1997 | Shinohara et al. ..... 156/661.11 |
| 5,599,740 A | 2/1997 | Jang et al. ................... 437/190 |
| 5,719,085 A | 2/1998 | Moon et al. ................. 438/424 |
| 5,850,105 A | 12/1998 | Dawson et al. ............. 257/758 |
| 5,856,220 A * | 1/1999 | Wang et al. ................. 438/254 |
| 5,858,863 A * | 1/1999 | Yokoyama et al. ......... 438/514 |
| 5,872,052 A | 2/1999 | Iyer ............................ 438/622 |
| 5,872,065 A * | 2/1999 | Sivaramakrishnan ....... 438/784 |
| 6,030,881 A * | 2/2000 | Papasouliotis et al. ...... 438/424 |
| 6,162,723 A * | 12/2000 | Tanaka ........................ 438/638 |
| 6,182,603 B1 * | 2/2001 | Shang et al. ................. 118/723 |

OTHER PUBLICATIONS

T. Abraham, "Reactive Facet Tapering of Plasma Oxide For Multilevel Interconnect Applications," *IEEE, V–MIC Conference—Jun. 15–16, 1987*, pp. 115–121 (Jun. 1987).

B. Lee et al., "Dielectric Planarization Techniques For Narrow Pitch Multilevel Interconnects," *IEEE, V–MIC Conference—Jun. 15–16, 1987*, pp. 85–92 (Jun. 1987).

* cited by examiner

*Primary Examiner*—Felisa Hiteshew
*Assistant Examiner*—Lan Vinh
(74) *Attorney, Agent, or Firm*—Townsend and Townsend and Crew LLP

(57) ABSTRACT

An improved method of forming a dielectric layer over a substrate disposed in a substrate processing chamber and cleaning deposition material off the chamber's interior wall and surfaces. The method breaks an in-situ chamber cleaning operation that is commonly performed after film deposition into two separate steps. The first step is done after a portion of the dielectric layer is deposited over the substrate. The second step then completes the in-situ chamber cleaning operation and is performed after deposition of the dielectric layer is completed. Both the first and second steps of the cleaning operation flow remotely dissociated fluorine atoms into the chamber to etch away material deposited on the chamber walls. The first step of the chamber cleaning process has the added benefit of incorporating small amounts of fluorine into the dielectric layer being deposited and isotropically etching the layer to improve the layer's gap-fill capability.

19 Claims, 6 Drawing Sheets

MULTISTEP CHAMBER CLEANING AND FILM DEPOSITION PROCESS USING A REMOTE PLASMA THAT ALSO ENHANCES FILM GAP FILL

BACKGROUND OF THE INVENTION

The present invention relates to the manufacture of integrated circuits on a substrate. More specifically, the present invention relates to a multistep chamber clean process that can be used to improve the gap fill capability of films deposited over the substrate without subjecting the substrate to a potentially damaging plasma.

One of the primary steps in the fabrication of modern semiconductor devices is the formation of a thin film on a semiconductor substrate by chemical reaction of gases. Such a deposition process is referred to as chemical vapor deposition or CVD. Conventional thermal CVD processes supply reactive gases to the substrate surface where heat-induced chemical reactions take place to produce a desired film. Plasma enhanced CVD techniques, on the other hand, promote excitation and/or dissociation of the reactant gases by the application of radio frequency (RF) energy to a reaction zone near the substrate surface, thereby creating a plasma. The high reactivity of the species in the plasma reduces the energy required for a chemical reaction to take place, and thus lowers the temperature required for such CVD processes as compared to conventional thermal CVD processes.

CVD techniques may used to deposit both conductive and insulative films during the fabrication of integrated circuits. For applications such as the deposition of insulation films as premetal or intermetal dielectric layers in an integrated circuit, one important physical property of the CVD film is its ability to completely fill gaps between adjacent structures without leaving voids within the gap. This property is referred to as the film's gap fill capability. Gaps that may require filling include spaces between adjacent raised structures such as transistor gates or conductive lines and etched trenches or the like.

As semiconductor device geometries have decreased in size over the years, the aspect ratio of such gaps has dramatically increased. (Aspect ratio is defined as the height of the gap divided by the width of the gap). Gaps having a combination of a high aspect ratio and a small width present a challenge for semiconductor manufacturers to completely fill. In short, the challenge usually is to prevent the deposited film from growing in a manner that closes off the gap before it is filled.

The semiconductor industry is continuously striving to develop new technologies and new film deposition chemistries to address challenges such as the gap fill issue. For example, several years ago some manufacturers switched from a silane-based chemistry for the deposition of intermetal dielectric silicon oxide layers to a TEOS-based (tetraethoxysilane) chemistry. This switch was at least in part due to the improved gap fill capability of the TEOS-based oxide layers. While a TEOS-based chemistry does indeed have improved gap fill capabilities, it too runs up against limitations when required to completely fill sufficiently high aspect ratio, small-width gaps.

One process that the semiconductor industry has developed to improve the gap fill capability of a variety of different deposition processes, including TEOS-based silicon oxide deposition chemistries, is the use of a multistep deposition and etching process. Such a process is often referred to as a deposition/etch/deposition process or "dep/etch/dep" for short. Well known dep/etch/dep processes divide the deposition of the gap fill layer into two or more steps separated by a plasma etch step. The plasma etch step etches the upper corners of the first deposited film more than the film portion deposited on the sidewall and lower portion of the gap thereby enabling the subsequent deposition step to fill the gap without prematurely closing it off. Such dep/etch/dep processes can be performed using either multiple chambers (separate chambers dedicated solely to either the deposition or etch steps) or with a single chamber in an in-situ process. Generally, for any given deposition chemistry, dep/etch/dep processes can be used to fill higher aspect ratio, small-width gaps than a standard deposition step for the particular chemistry would allow.

Another process that the semiconductor industry has developed to address the gap fill issue is the development of high density plasma (HDP) processing CVD techniques. HDP-CVD techniques form a high density plasma at low vacuum pressures and introduce argon or another sputtering agent into the deposition process. The combination of deposition gases and sputtering agent result in a process that simultaneously deposits a film over the substrate and etches the growing film. For this reason, HDP-CVD techniques are sometimes referred to as simultaneous dep/etch processes. HDP-CVD processes generally have improved gap fill capabilities as compared to similar non-HDP-CVD processes.

As integrated circuit feature sizes some of the devices fabricated on the substrate become increasingly sensitive to damage that may be caused by plasma processing techniques including the dep/etch/dep and HDP-CVD techniques described above. This is particularly true as feature sizes are reduced to dimensions of 0.18 microns and less. Thus, some manufacturers attempt to avoid using plasma processing techniques on semiconductor substrates if at all possible.

In addition to depositing a desired film over the substrate, thermal CVD and plasma enhanced CVD deposition techniques typically leave unwanted deposition material on interior surfaces of the deposition chamber including the chamber walls. This unwanted deposition material may be removed with a chamber dry clean operation (also referred to as an in-situ clean operation). Such a dry clean operation is typically performed after the deposition operation is completed and the substrate is removed from the chamber. Etchant gases are then introduced into the chamber to remove the unwanted deposits. The dry clean operation can be a thermal etching process or more commonly a plasma etching process. It can also be done by flowing remotely dissociated etchant atoms into the chamber to etch the deposits. Such dry clean operations can be performed after a CVD film is deposited over a single or after n wafers. The actual frequency of the dry clean operation depends on a number of factors including the chemistry of the CVD process, the length of the process or thickness of film deposited over the substrate and the deposition conditions among other factors.

In view of the above problems with prior art gap fill deposition techniques, new and improved methods of filling gaps are desirable.

SUMMARY OF THE INVENTION

The present invention solves the above described problems associated with previously known deposition processes. The method provides an improved technique of forming a dielectric layer over a substrate disposed in a substrate processing chamber and cleaning deposition material off the chamber's interior wall and surfaces. The method breaks an in-situ chamber cleaning operation that flows a remotely dissociated etchant gas (e.g., fluorine) into the chamber into two or more separate steps. Typically, previously known chamber cleaning operations that employ such remotely dissociated etchants flow the dissociated atoms into the chamber after deposition of one or more layers within the chamber is completed and without the substrate being present in the chamber. The present invention, however, performs a portion of the chamber cleaning process prior to completing the deposition of the desired layer and with the substrate in the chamber.

According to one embodiment of the present invention, a chamber clean operation is divided into two steps. The first step is done after a portion of the dielectric layer is deposited over the substrate and with the substrate in the chamber. The second step then completes the in-situ chamber cleaning operation and is performed after deposition of the dielectric layer is completed and the substrate has been removed from the chamber. Both the first and second steps of the cleaning operation flow remotely dissociated atoms (preferably fluorine) into the chamber to etch away material deposited on the chamber walls. The first step of the chamber cleaning process has the added benefit of incorporating small amounts of fluorine into the dielectric layer being deposited and isotropically etching the layer to improve the layer's gap-fill capability. The chamber cleaning process does not form a plasma within the substrate processing chamber and therefore does not result in any plasma-induced defects on the substrate.

Other embodiments of the invention divide the chamber clean operation into three or more steps with alternating deposition and chamber clean steps occurring prior to a final chamber clean step.

The present invention also provides an apparatus for performing multiple step chamber clean operations such as those described in the preceding paragraphs. The apparatus of the present invention includes a housing that forms a vacuum chamber, a remote plasma system that is fluidly coupled to the vacuum chamber and a gas distribution system that is adapted to flow gases into the vacuum chamber and to flow an etchant gas into the remote plasma system. The apparatus also includes a controller that controls the gas distribution system and a memory, coupled to the controller. The memory includes a computer readable medium having a computer readable program embodied therein for directing operation of the substrate processing system to deposit a film. The computer readable program includes instructions to control the gas distribution system to flow deposition gases into the vacuum chamber to deposit a first portion of the dielectric layer over a substrate disposed in the vacuum chamber; instructions to control the gas distribution system to flow an etchant gas into the remote plasma system and flow remotely dissociated species generated within the remote plasma system into the vacuum chamber after the first portion of the layer is deposited and before the substrate is removed from the chamber; instructions to control the gas distribution system to flow deposition gases into the vacuum chamber after the remotely dissociated species are flowed into the chamber to deposit a second portion of the dielectric layer over the first portion; and instructions to control the gas distribution system to flow an etchant gas into the remote plasma system and flow remotely dissociated species generated within the remote plasma system into the vacuum chamber after the second portion of the layer is deposited and after the substrate is removed from the chamber.

These and other embodiments of the present invention, as well as its advantages and features, are described in more detail in conjunction with the text below and attached figures.

DESCRIPTION OF THE SPECIFIC EMBODIMENTS

I. Introduction

The present invention provides an improved method of forming a dielectric layer over a substrate disposed in a substrate processing chamber and cleaning deposition material off the chamber's interior wall and surfaces. The method breaks an in-situ chamber cleaning operation that flows a remotely dissociated etchant gas (e.g., fluorine) into the chamber into two or more separate steps. The first of these clean steps is performed with the substrate in the chamber and after an initial portion of the desired layer is deposited. The final clean step is performed after deposition of the layer has been completed and after the substrate is removed from the chamber.

The present invention can be used to help facilitate the fabrication of integrated circuits having a variety of feature sizes and is particularly useful in the fabrication of devices having minimum features sizes of 0.35 microns and less. The method of the invention can be practiced with CVD chambers of conventional design providing the chamber has the capability to flow remotely dissociated species into the chamber.

II. Exemplary Substrate Processing Chamber

Figure 1A:
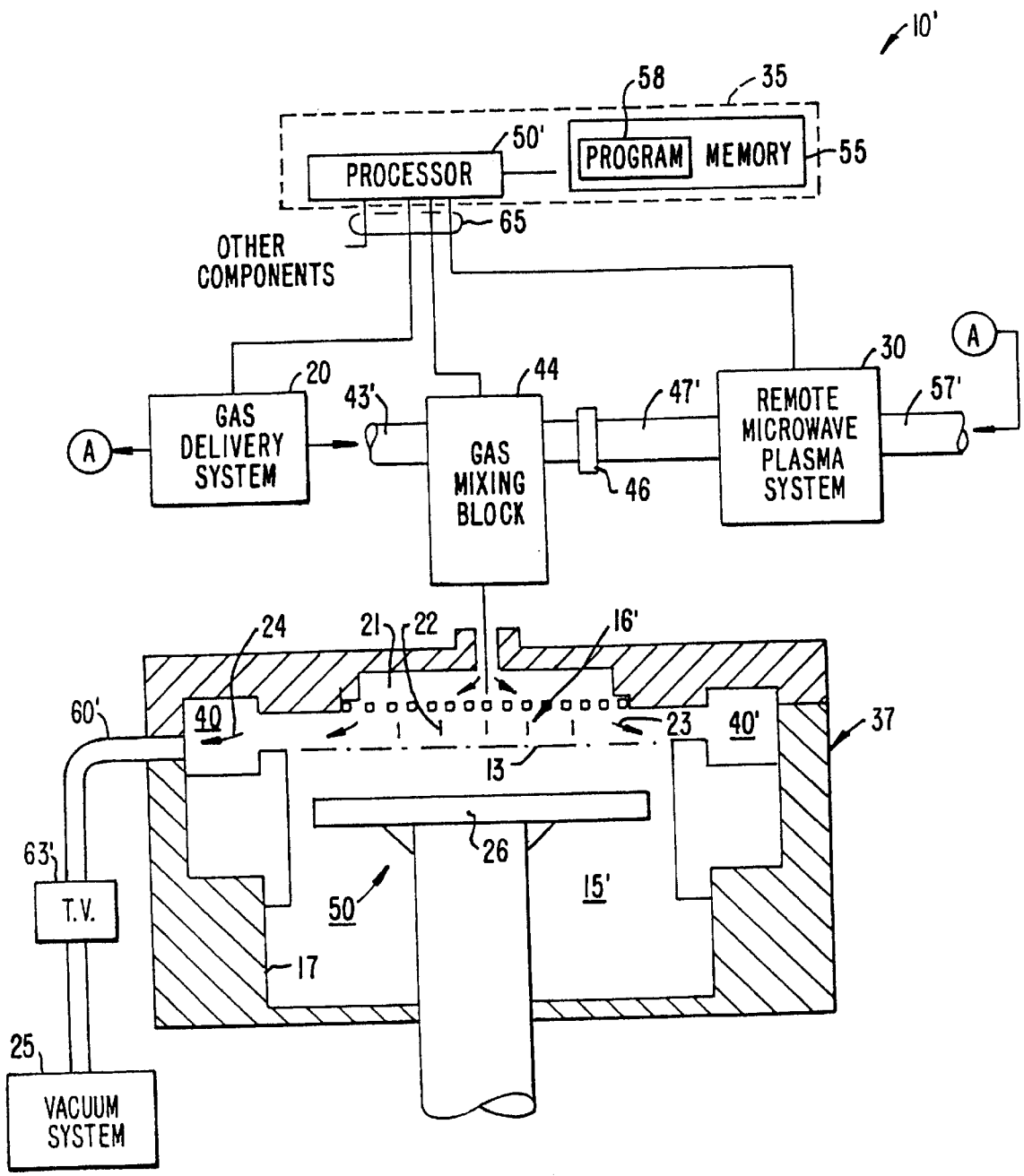
FIG. 1A is a simplified representation of an exemplary CVD apparatus that can be used to practice the method of the present invention.

FIG. 1A is a simplified diagram of an exemplary chemical vapor deposition ("CVD") system 10 in which the method of the present invention can be practiced. This system is suitable for performing thermal, sub-atmospheric CVD ("SACVD") processes, as well as other processes, such as reflow, drive-in, cleaning, etching, and gettering processes. Multiple-step processes can also be performed on a single substrate or wafer without removing the substrate from the chamber. The major components of the system include, among others, a vacuum chamber 15 that receives process and other gases from a gas delivery system 20, a vacuum system 25, a remote plasma system 30, and a control system 35. These and other components are described in more detail below.

CVD apparatus 10 includes an enclosure assembly 37 that forms vacuum chamber 15 with a gas reaction area 16. A gas distribution plate 21 disperses reactive gases and other gases, such as purge gases, through perforated holes toward a wafer (not shown) that rests on a vertically movable heater 26 (also referred to as a wafer support pedestal). Between gas distribution plate 21 and the wafer is gas reaction area 16. Heater 26 can be controllably moved between a lower position, where a wafer can be loaded or unloaded, for example, and a processing position closely adjacent to the gas distribution plate 21, indicated by a dashed line 13, or to other positions for other purposes, such as for an etch or cleaning process. A center board (not shown) includes sensors for providing information on the position of the wafer.

Heater 26 includes an electrically resistive heating element (not shown) enclosed in a ceramic. The ceramic protects the heating element from potentially corrosive chamber environments and allows the heater to attain temperatures up to about 800° C. In an exemplary embodiment, all surfaces of heater 26 exposed to vacuum chamber 15 are made of a ceramic material, such as aluminum oxide ($Al_2O_3$ or alumina) or aluminum nitride.

Reactive and carrier gases are supplied from gas delivery system 20 through supply lines 43 into a gas mixing box (also called a gas mixing block) 44, where they are mixed together and delivered to gas distribution plate 21. Gas delivery system 20 includes a variety of gas sources and appropriate supply lines to deliver a selected amount of each source to chamber 15 as would be understood by a person of skill in the art. Generally, supply lines for each of the gases include shut-off valves that can be used to automatically or manually shut-off the flow of the gas into its associated line, and mass flow controllers or other types of controllers that measure the flow of gas or liquid through the supply lines. Depending on the process run by system 10, some of the sources may actually be liquid sources, such as tetraethylorthosilane ("TEOS"), triethylborate ("TEB") and/or triethylphosphate ("TEPO"), rather than gases. When liquid sources are used, gas delivery system includes a liquid injection system or other appropriate mechanism (e.g., a bubbler) to vaporize the liquid. Vapor from the liquids is then usually mixed with a carrier gas as would be understood by a person of skill in the art. Gas delivery system may also include an ozone generator to generate ozone from a supply of molecular oxygen when ozone is required by a process run on system 10.

Gas mixing box 44 is a dual input mixing block coupled to process gas supply lines 43 and to a cleaning/etch gas conduit 47. A valve 46 operates to admit or seal gas or plasma from gas conduit 47 to gas mixing block 44. Gas conduit 47 receives gases from an integral remote microwave plasma system 30, which has an inlet 57 for receiving input gases. During deposition processing, gas supplied to the plate 21 is vented toward the wafer surface (as indicated by arrows 23), where it may be uniformly distributed radially across the wafer surface in a laminar flow.

Purging gas may be delivered into the vacuum chamber 15 from gas distribution plate 21 and/or from inlet ports or tubes (not shown) through the bottom wall of enclosure assembly 37. Purge gas introduced from the bottom of chamber 15 flows upward from the inlet port past the heater 26 and to an annular pumping channel 40. Vacuum system 25 which includes a vacuum pump (not shown), exhausts the gas (as indicated by arrows 24) through an exhaust line 60. The rate at which exhaust gases and entrained particles are drawn from the annular pumping channel 40 through the exhaust line 60 is controlled by a throttle valve system 63.

Remote microwave plasma system 30 can produce a plasma for selected applications, such as chamber cleaning or etching native oxide or residue from a process wafer. Plasma species produced in the remote plasma system 55 from precursors supplied via the input line 57 are sent via the conduit 47 for dispersion through gas distribution plate 20 to vacuum chamber 15. Remote microwave plasma system 30 is integrally located and mounted below chamber 15 with conduit 47 coming up alongside the chamber to gate valve 46 and gas mixing box 44, which is located above chamber 15. Precursor gases for a cleaning application may include fluorine, chlorine and/or other reactive elements. Remote microwave plasma system 30 may also be adapted to deposit CVD films flowing appropriate deposition precursor gases into remote microwave plasma system 30 during a film deposition process.

The temperature of the walls of deposition chamber 15 and surrounding structures, such as the exhaust passageway, may be further controlled by circulating a heat-exchange liquid through channels (not shown) in the walls of the chamber. The heat-exchange liquid can be used to heat or cool the chamber walls depending on the desired effect. For example, hot liquid may help maintain an even thermal gradient during a thermal deposition process, whereas a cool liquid may be used to remove heat from the system during an in-situ plasma process, or to limit formation of deposition products on the walls of the chamber. Gas distribution manifold 21 also has heat exchanging passages (not shown). Typical heat-exchange fluids water-based ethylene glycol mixtures, oil-based thermal transfer fluids, or similar fluids. This heating, referred to as heating by the "heat exchanger", beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

System controller 35 controls activities and operating parameters of the deposition system. System controller 35 includes a computer processor 50 and a computer-readable memory 55 coupled to processor 50. Processor 50 executes system control software, such as a computer program 58 stored in memory 70. Memory 70 is preferably a hard disk drive but may be other kinds of memory, such as read-only memory or flash memory. System controller 35 also includes a floppy disk drive (not shown).

Processor 50 operates according to system control software (program 58), which includes computer instructions that dictate the timing, mixture of gases, chamber pressure, chamber temperature, microwave power levels, pedestal position, and other parameters of a particular process. Control of these and other parameters is effected over control lines 65, only some of which are shown in FIG. 1A, that communicatively couple system controller 35 to the heater, throttle valve, remote plasma system and the various valves and mass flow controllers associated with gas delivery system 20.

Processor 50 has a card rack (not shown) that contains a single-board computer, analog and digital input/output boards, interface boards and stepper motor controller boards. Various parts of the CVD system 10 conform to the Versa Modular European (VME) standard which defines board, card cage, and connector dimensions and types. The VME standard also defines the bus structure having a 16-bit data bus and 24-bit address bus.

Figure 1B:
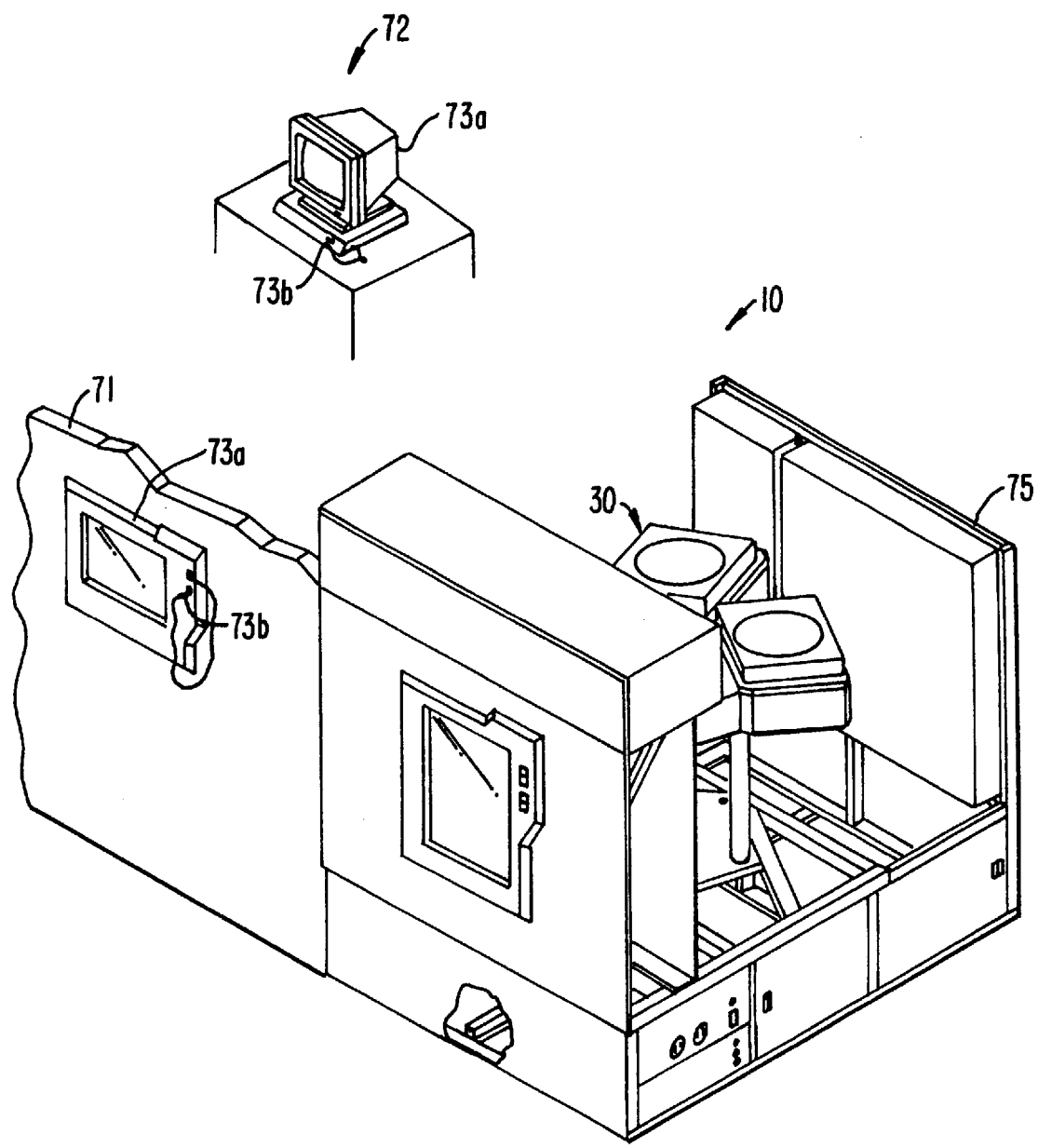
FIG. 1B is a simplified representation of one embodiment of a user interface for the exemplary CVD apparatus of FIG. 1A.

FIG. 1B is a simplified diagram of a user interface that can be used to monitor and control the operation of CVD system 10. As shown in FIG. 1B, CVD system 10 may be one chamber of a multichamber substrate processing system. In such a multichamber system wafers may be transferred from one chamber to another via a computer controlled robot for additional processing. In some cases the wafers are transferred under vacuum or a selected gas. The interface between a user and system controller 35 is a CRT monitor 73a and a light pen 73b. A mainframe unit 75 provides electrical, plumbing, and other support functions for the CVD apparatus 10. Exemplary multichamber system mainframe units compatible with the illustrative embodiment of the CVD apparatus are currently commercially available as the Precision 5000™ and the Centura 5200™ systems from APPLIED MATERIALS, INC. of Santa Clara, Calif.

In the preferred embodiment two monitors 73a are used, one mounted in the clean room wall 71 for the operators, and the other behind the wall 72 for the service technicians. Both monitors 73a simultaneously display the same information, but only one light pen 73b is enabled. The light pen 73b detects light emitted by the CRT display with a light sensor in the tip of the pen. To select a particular screen or function, the operator touches a designated area of the display screen and pushes the button on the pen 73b. The touched area changes its highlighted color, or a new menu or screen is displayed, confirming communication between the light pen and the display screen. As a person of ordinary skill would readily understand, other input devices, such as a keyboard, mouse, or other pointing or communication device, may be used instead of or in addition to the light pen 73b to allow the user to communicate with the processor.

Figure 1C:
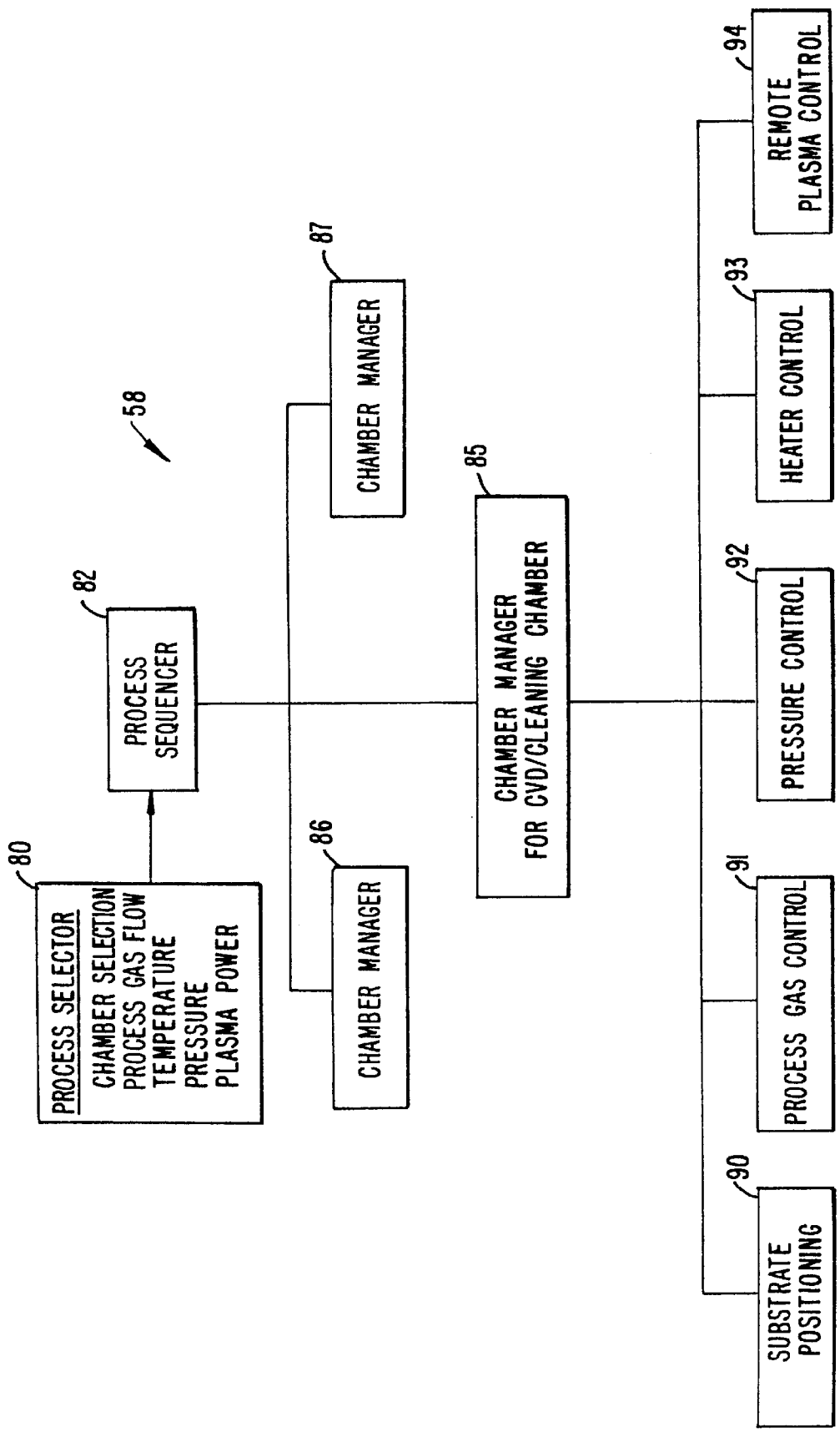
FIG. 1C is a block diagram of one embodiment of the hierarchical control structure of the system control software for the exemplary CVD apparatus of FIG. 1A.

FIG. 1C is a block diagram of one embodiment of the hierarchical control structure of the system control software, computer program 58, for the exemplary CVD apparatus of FIG. 1A. Processes such as those for depositing a film, performing a dry chamber clean, or performing reflow or drive-in operations can be implemented under the control of computer program 58 that is executed by processor 50. The computer program code can be written in any conventional computer readable programming language, such as 68000 assembly language, C, C++, Pascal, Fortran, or other language. Suitable program code is entered into a single file, or multiple files, using a conventional text editor and is stored or embodied in a computer-usable medium, such as the system memory.

If the entered code text is in a high-level language, the code is compiled, and the resultant compiler code is then linked with an object code of precompiled Windows™ library routines. To execute the linked compiled object code, the system user invokes the object code, causing the computer system to load the code in memory, from which the CPU reads and executes the code to configure the apparatus to perform the tasks identified in the program.

A user enters a process set number and process chamber number into a process selector subroutine 80 by using the light pen to select a choice provided by menus or screens displayed on the CRT monitor. The process sets, which are predetermined sets of process parameters necessary to carry out specified processes, are identified by predefined set numbers. The process selector subroutine 80 identifies (i) the desired process chamber, and (ii) the desired set of process parameters needed to operate the process chamber for performing the desired process. The process parameters for performing a specific process relate to process conditions such as, for example, process gas composition and flow rates, pedestal temperature, chamber wall temperature pressure and plasma conditions such as magnetron power levels and chamber wall temperature. The process selector subroutine 80 controls what type of process (e.g. deposition, wafer cleaning, chamber cleaning, chamber gettering, reflowing) is performed at a certain time in the chamber. In some embodiments, there may be more than one process selector subroutine. The process parameters are provided to the user in the form of a recipe and may be entered utilizing the light pen/CRT monitor interface.

A process sequencer subroutine 82 has program code for accepting the identified process chamber and process parameters from the process selector subroutine 80, and for controlling the operation of the various process chambers. Multiple users can enter process set numbers and process chamber numbers, or a single user can enter multiple process set numbers and process chamber numbers, so process sequencer subroutine 82 operates to schedule the selected processes in the desired sequence. Preferably, process sequencer subroutine 82 includes program code to perform the steps of (i) monitoring the operation of the process chambers to determine if the chambers are being used, (ii) determining what processes are being carried out in the chambers being used, and (iii) executing the desired process based on availability of a process chamber and the type of process to be carried out.

Conventional methods of monitoring the process chambers, such as polling methods, can be used. When scheduling which process is to be executed, process sequencer subroutine 82 can be designed to take into consideration the present condition of the process chamber being used in comparison with the desired process conditions for a selected process, or the "age" of each particular user-entered request, or any other relevant factor a system programmer desires to include for determining scheduling priorities.

Once process sequencer subroutine 82 determines which process chamber and process set combination is going to be executed next, process sequencer subroutine 82 initiates execution of the process set by passing the particular process set parameters to a chamber manager subroutine 85 which controls multiple processing tasks in a particular process chamber according to the process set determined by process sequencer subroutine 82. For example, chamber manager subroutine 85 has program code for controlling CVD and cleaning process operations in chamber 15. Chamber manager subroutine 85 also controls execution of various chamber component subroutines which control operation of the chamber components necessary to carry out the selected process set. Examples of chamber component subroutines are substrate positioning subroutine 90, process gas control subroutine 91, pressure control subroutine 92, heater control subroutine 93 and remote plasma control subroutine 94. Depending on the specific configuration of the CVD chamber, some embodiments include all of the above subroutines, while other embodiments may include only some of the subroutines or other subroutines not described. Those having ordinary skill in the art would readily recognize that other chamber control subroutines can be included depending on what processes are to be performed in the process chamber. In multichamber systems, additional chamber manager subroutines 86, 87 control the activities of other chambers.

In operation, the chamber manager subroutine 85 selectively schedules or calls the process component subroutines in accordance with the particular process set being executed. Chamber manager subroutine 85 schedules the process component subroutines much like the process sequencer subroutine 82 schedules which process chamber and process set are to be executed next. Typically, chamber manager subroutine 85 includes steps of monitoring the various chamber components, determining which components need to be operated based on the process parameters for the process set to be executed, and initiating execution of a chamber component subroutine responsive to the monitoring and determining steps.

Operation of particular chamber component subroutines will now be described with reference to FIGS. 1A and 1C. The substrate positioning subroutine 90 comprises program code for controlling chamber components that are used to load the substrate onto the heater 26 and, optionally, to lift the substrate to a desired height in the chamber to control the spacing between the substrate and the gas distribution manifold 21. When a substrate is loaded into the process chamber 15, the heater 26 is lowered to receive the substrate and then the heater 26 is raised to the desired height. In operation, the substrate positioning subroutine 90 controls movement of the heater 26 in response to process set parameters related to the support height that are transferred from the chamber manager subroutine 85.

Process gas control subroutine 91 has program code for controlling process gas composition and flow rates. Process gas control subroutine 91 controls the state of safety shut-off valves, and also ramps the mass flow controllers up or down to obtain the desired gas flow rate. Typically, process gas control subroutine 91 operates by opening the gas supply lines and repeatedly (i) reading the necessary mass flow controllers, (ii) comparing the readings to the desired flow rates received from the chamber manager subroutine 157a, and (iii) adjusting the flow rates of the gas supply lines as necessary. Furthermore, process gas control subroutine 91 includes steps for monitoring the gas flow rates for unsafe rates, and activating the safety shut-off valves when an unsafe condition is detected. Alternative embodiments could have more than one process gas control subroutine, each subroutine controlling a specific type of process or specific sets of gas lines.

In some processes, an inert gas, such as nitrogen or argon, is flowed into the chamber to stabilize the pressure in the chamber before reactive process gases are introduced. For these processes, process gas control subroutine 91 is programmed to include steps for flowing the inert gas into the chamber for an amount of time necessary to stabilize the pressure in the chamber, and then the steps described above would be carried out. Additionally, when a process gas is to be vaporized from a liquid precursor, such as TEOS, TEPO, or TEB, process gas control subroutine 91 is written to include steps for bubbling a delivery gas such as helium through the liquid precursor in a bubbler assembly, or controlling a liquid injection system to spray or squirt liquid into a stream of carrier gas, such as helium. When a bubbler is used for this type of process, process gas control subroutine 91 regulates the flow of the delivery gas, the pressure in the bubbler, and the bubbler temperature in order to obtain the desired process gas flow rates. As discussed above, the desired process gas flow rates are transferred to process gas control subroutine 91 as process parameters.

Furthermore, process gas control subroutine 91 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 92 includes program code for controlling the pressure in the chamber by regulating the aperture size of the throttle valve in the exhaust system of the chamber. The aperture size of the throttle valve is set to control the chamber pressure at a desired level in relation to the total process gas flow, the size of the process chamber, and the pumping set-point pressure for the exhaust system. When the pressure control subroutine 92 is invoked, the desired or target pressure level is received as a parameter from the chamber manager subroutine 85. Pressure control subroutine 92 measures the pressure in the chamber by reading one or more conventional pressure manometers connected to the chamber, compares the measure value(s) to the target pressure, obtains proportional, integral, and differential ("PID") values corresponding to the target pressure from a stored pressure table, and adjusts the throttle valve according to the PID values. Alternatively, the pressure control subroutine 92 can be written to open or close the throttle valve to a particular aperture size, i.e. a fixed position, to regulate the pressure in the chamber. Controlling the exhaust capacity in this way does not invoke the feedback control feature of the pressure control subroutine 92.

Heater control subroutine 93 includes program code for controlling the current to a heating unit that is used to heat the substrate. Heater control subroutine 93 is also invoked by the chamber manager subroutine 85 and receives a target, or set-point, temperature parameter. Heater control subroutine 93 measures the temperature by measuring voltage output of a thermocouple located in the heater, comparing the measured temperature to the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. Heater control subroutine 93 includes the ability to gradually control a ramp up or down of the heater temperature. This feature helps to reduce thermal cracking in the ceramic heater. Additionally, a built-in fail-safe mode can be included to detect process safety compliance, and can shut down operation of the heating unit if the process chamber is not properly set up.

Remote plasma control subroutine 94 includes program code to control the operation of remote plasma system 30. Plasma control subroutine 94 is invoked by chamber manager 85 in a manner similar to the other subroutines just described.

Although the invention is described herein as being implemented in software and executed upon a general purpose computer, those of skill in the art will realize that the invention could be implemented using hardware such as an application specific integrated circuit (ASIC) or other hardware circuitry. As such, it should be understood that the invention can be implemented, in whole or in part, is software, hardware or both. Those skilled in the art will also realize that it would be a matter of routine skill to select an appropriate computer system to control CVD system 10.

III. Conventional Chamber Clean Process

As previously described, one problem that arises during CVD deposition processes is that unwanted deposition occurs on interior surfaces of the deposition chamber such as the interior walls. Unless removed, this unwanted deposition is a source of particulate contaminants that may interfere with subsequent processing steps and adversely effect wafer yield.

To avoid such problems, the inside surface of the chamber is cleaned regularly to remove the unwanted deposition material from the chamber walls and similar areas of the processing chamber. This procedure is performed as a standard chamber clean operation where an etchant gas is used to remove (etch) the deposited material from the chamber walls and other areas. Basically, the etchant gas reacts with the unwanted products to form a volatile product that can be pumped from the chamber through the chamber's exhaust stream. Such cleaning procedures are commonly performed between deposition steps for every wafer or every n wafers.

Some in-situ clean processes flow an etchant gas into the substrate deposition chamber and form a plasma from the gas within the chamber. Other, more recently developed in-situ clean processes flow a remotely dissociated etchant into the chamber from a remote plasma source, such as remote plasma source 30 described above. In either case the chamber cleaning process occurs after the completion of a deposition step and after the substrate has been removed from the chamber.

IV. The Multistep Chamber Clean Process According to the Present Invention

Figure 2:
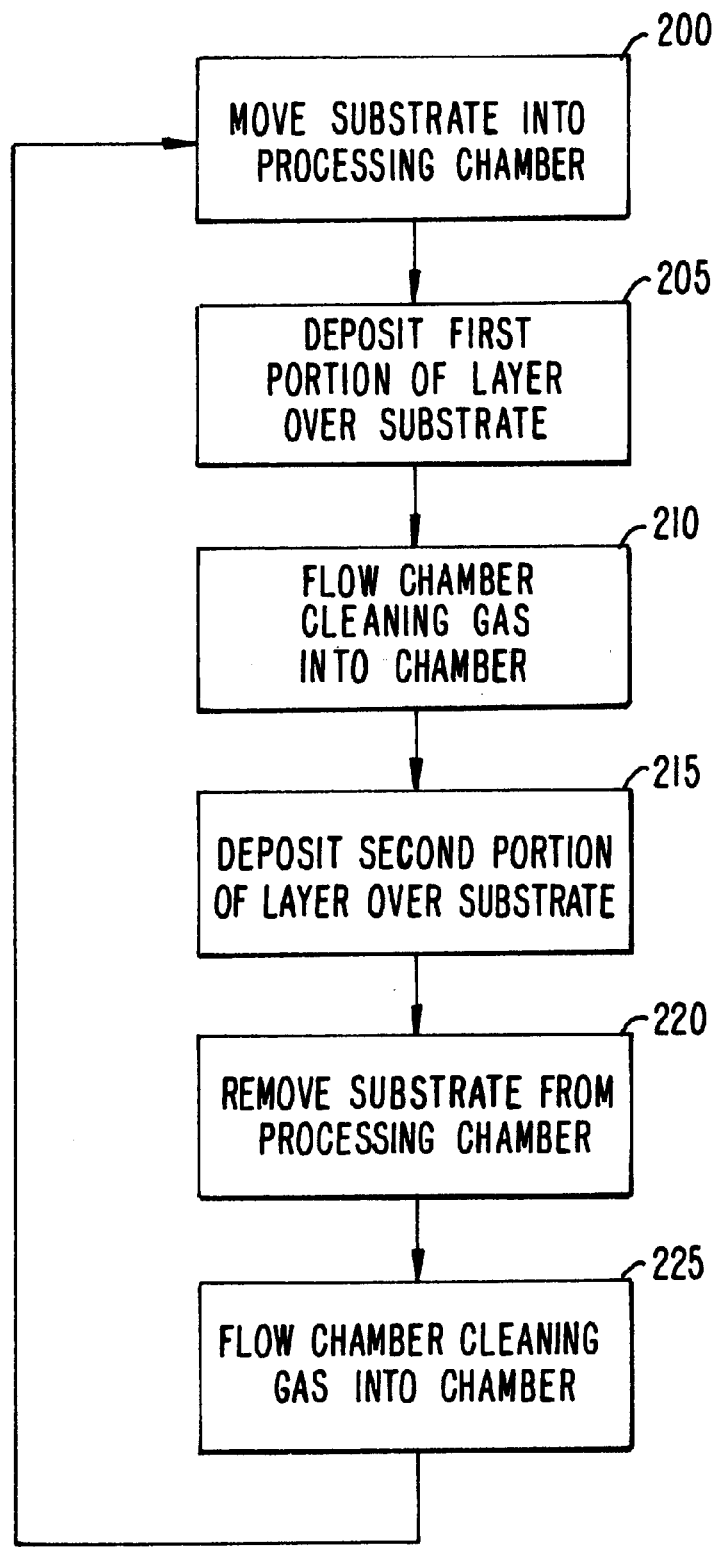
FIG. 2 is a flowchart illustrating one embodiment of the method of the present invention.

The present invention divides a conventional chamber clean process that flows remotely dissociated etchant atoms into the chamber into multiple steps. FIG. 2 is a flowchart illustrating one embodiment of the multistep clean process according to the present invention. As previously stated, the present invention can be used in conjunction with depositing a variety of different types of layers for a variety of different purposes. To help facilitate an understanding of the present invention, however, the description of FIG. 2 will reference FIGS. 3A–3C, which illustrate one particular application of the present invention in a process used to deposit an intermetal dielectric layer over a substrate 300 having adjacent metal lines 305 formed thereon. Adjacent lines 305 form a gap 310 therebetween. The process described with respect to FIGS. 2 and 3A–3C takes place in exemplary CVD chamber 15 described above but could also be performed in other CVD chambers of conventional design as long as the chamber has a mechanism to remotely dissociate the etchant and flow the remotely dissociated species into the chamber.

As shown in FIG. 2, a substrate (FIG. 3A, substrate 300) over which a layer is to be deposited is first transferred into chamber 15 (step 200). Next, the film forming or deposition process is started to form a first portion 315 (FIG. 3B) of a dielectric film layer over substrate 300. First portion 315 of the dielectric film partially fills in gap 310 between lines 305. As shown in FIG. 3B, even though deposition of film portion 315 is highly conformal, it may not be 100% conformal so that the outer surface 320 of the film defines a neck region of gap 310 that is narrower at the upper portion of the gap than at the bottom of the gap. If the film deposition process were to continue and the aspect ratio of the gap is sufficiently high, the gap may be pinched off leaving an unfilled area between lines 305. Such an unfilled area is typically referred to as a void.

The present invention prevents the formation of such a void by stopping the deposition of the first film portion and flowing the cleaning gas into the chamber to begin the chamber clean operation (step 210). The clean gas, $NF_3$ in one embodiment, is flowed into remote plasma system 30 to dissociate the molecules of the clean gas and form highly reactive species. The dissociated species are then introduced into chamber 15 to begin a first step of the in-situ chamber clean process.

In this manner deposits that have built up on the interior surfaces of the chamber during the deposition of film portion 315 are etched away. Initiating the clean process at this stage has the additional benefit of widening gap 310 so that it can be subsequently filled without forming a void. The remote fluorine clean is an isotropic etch that removes more material from the top of gap 310 than at the bottom of the gap. FIG. 3C shows how clean process stage 210 etches the outer surface of layer 315 back to a surface 325. As evident in FIG. 3C, gap 310 is now wider at the top than the bottom allowing for the gap to be completely filled when the deposition gases are reintroduced into the chamber (step 215) to complete deposition of the dielectric layer and completely fill gap 310.

FIG. 3C also shows the formation of this second portion, portion 330, of the dielectric layer.

After deposition of the dielectric layer is completed, the substrate is removed from the chamber (step 220) and the second step of the clean process is performed (step 225). The second step of the clean process again flows the clean gas into the remote plasma system 30 to form highly reactive species from the gas. The dissociated species are then introduced into chamber 15 to remove deposits that have built up on the chamber walls. Currently preferred embodiments of the invention flow remotely dissociated fluorine atoms into the chamber during clean steps 210, 225.

In one embodiment the chamber parameters (e.g., temperature, pressure, gas flow rates) are set substantially similar in steps 210 and 225. The inclusion of two clean steps 210, 225 takes more time to complete than if a single clean step was used at the end of processing (generally about 10–20% longer in some embodiments), but as previously stated, the extra clean step performed with the substrate in the chamber before deposition of the layer is completed improves the gap fill capability of the film and improves film quality when the deposited layer is one that can benefit from fluorine incorporation. Furthermore, final clean step 225 is shorter than it would otherwise be if clean step 210 was not implemented.

Dielectric layers 315, 330 can be a number of different dielectric layers that are used in the semiconductor industry for gap fill applications. For example, layers 315, 330 can be undoped silicate glass (USG) layers, phosphorus doped silicate glass (PSG), fluorine doped silicon glass (FSG) layers or low dielectric constant silicon-carbon films such as those deposited from a process gas of TEOS and trimethylsilane. In other embodiments, the present invention can be employed to improve the gap fill capability of boron phosphorus silicate glass (BPSG) films for PMD applications. The remotely dissociated fluorine atoms introduced into the chamber during step 210 of the cleaning process provides the additional benefit of incorporating fluorine into layer 315 that is also etched by the clean step. Fluorine generally tends to reduce the dielectric constant of USG and PSG films and has also been found to lower the reflow temperature of BPSG films.

The length of time for each clean step 210, 225 depends on a number of factors including the chemistry of the deposition process, the thickness of the deposited layer, chamber conditions during the clean process and the flow rate and type of etchant used. A person of skill in the art will be able to select appropriate times for steps 210, 225 taking these factors and others into consideration. In one embodiment, $NF_3$ is flowed into remote plasma system 30 at a rate of 950 sccm. Furthermore, the length of step 210 will be selected to sufficiently open gap 310 for subsequent filling. For many deposition chemistries, the wider the opening is for gap 310, the faster layer 330 can be deposited. Faster deposition rates are typically obtained by modifying appropriate deposition conditions as is known to those of skill in the art. Often faster deposition rates come at least partly at the expense of gap fill capability.

Figure 3A:
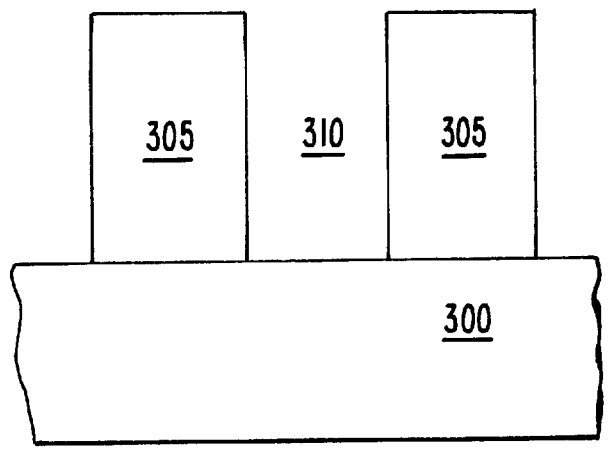
FIGS. 3A–3C are a simplified cross-sectional views of a partially completed integrated circuit structure formed according to the embodiment of the present invention illustrated in FIG. 2.
Figure 3B:
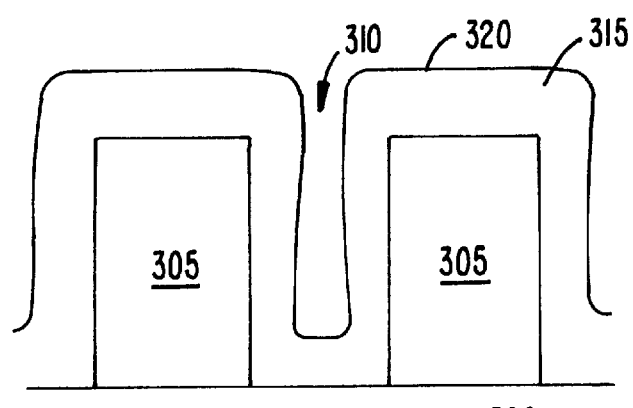
Figure 3C:
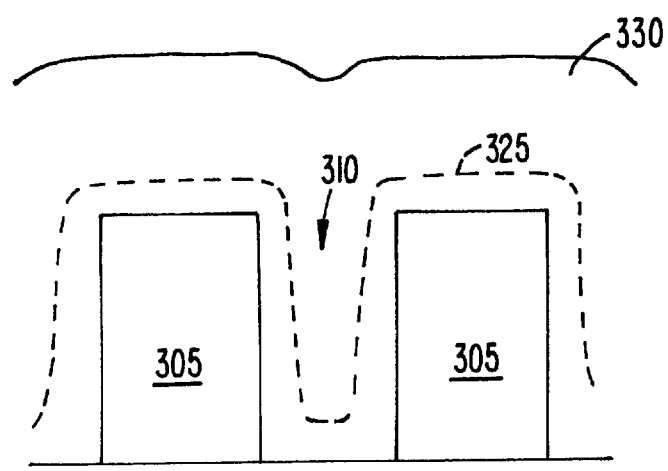
Figure 4:
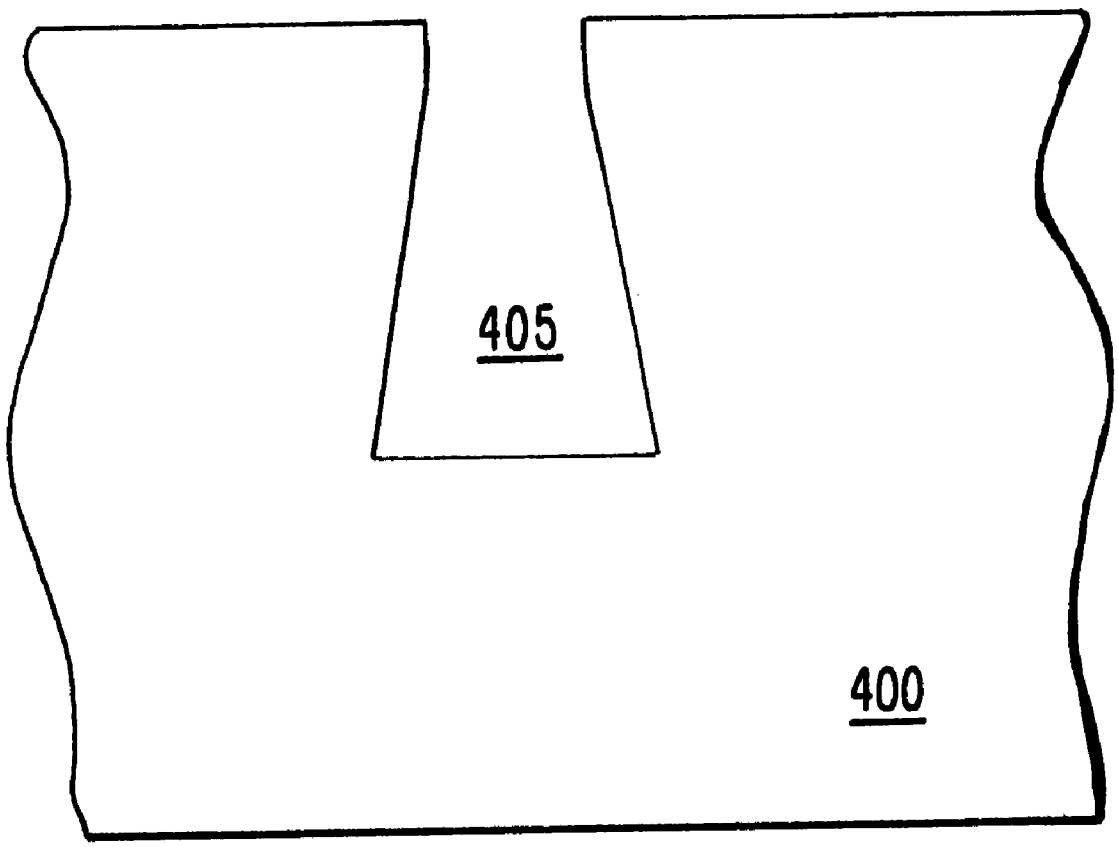
FIG. 4 is a simplified cross-sectional views of substrate having a trench with an irregular profile formed thereon for which the method of the present can be advantageously used to fill.

While FIGS. 3A to 3C show the present invention being used to fill a gap 310 that has relatively vertical sidewalls formed by adjacent metal lines 305, the present invention can also be used to fill gaps or trenches that have irregular profiles, such as those shown in FIG. 4. FIG. 4 shows a trench 405 etched in a substrate 400. Trench 405 has a tapered profile due to the difficulty involved in accurately controlling the profile of high aspect ratio etch processes. Because of its profile, trench 405 could not be satisfactorily filled by a deposition process that could deposit a 100% conformal film. The present invention could, however, deposit an initial layer within trench 405 and open or widen the gap in the initial layer with an intermediate clean step for subsequent filling. Depending on the steepness of the profile of trench 405, multiple intermediate clean steps may be required.

Having fully described several embodiments of the present invention, many other equivalent or alternative embodiments of the present invention will be apparent to those skilled in the art. For example, the multistep clean process illustrated in FIG. 2 includes two separate clean steps, it is possible in other embodiments to included three or more separate clean steps. Such embodiments would include additional and matching deposition and clean sequences that would occur between deposition step 210 and clean step 220. Such additional pairs of alternating deposition and clean steps can be used to further enhance the gap fill capabilities of a deposited layer. The improved gap fill capabilities, however, should be balanced against increased throughput as the additional steps will require additional process time as would be understood by a person of skill in the art. Also, remote plasma system 30 can be any system that can dissociate the etchant gas. One example of another suitable system is the Astron Fluorinator manufactured by Applied Science and Technology (ASTeX), of Woburn Mass. In one embodiment, when the Astron Fluorinator is used as the remote plasma source, the plasma is initiated with an argon flow and then the etchant gas (e.g., $NF_3$) flow is added to the argon flow.

In other alternative embodiments, the deposition process employed within chamber 15 is a plasma enhanced CVD deposition process or HDP CVD deposition process. In these embodiments, a higher than otherwise could be used deposition rate process can be employed to deposit the dielectric layer since the intermediate clean step will widen the portion of the film deposited between adjacent raised structures. Furthermore, the present invention can be employed with deposition process that require clean steps after n substrates are processed rather than after every substrate. In such a system, clean step 225 would only be performed after the nth substrate. Intermediate clean step 210 would, however, be performed for each of the n substrates. Also, other etchant gases besides $NF_3$ may be employed. Specific examples of such etchant gases include $F_2$ and $CF_x$ gases flow with $O_2$. Examples of $CF_x$ gases include $C_2F_6$, $C_3F_8$, and the like. These equivalents and alternatives are intended to be included within the scope of the present invention.

What is claimed is:

1. A method of cleaning deposits from the interior surfaces of a substrate processing chamber during a process for depositing a dielectric layer over a substrate disposed in the chamber, said method comprising:

depositing a first portion of the dielectric layer over the substrate;

stopping deposition of said first portion;

thereafter, keeping the substrate in the chamber and flowing remotely dissociated etchant atoms into the chamber;

thereafter, depositing a second portion of the dielectric layer over the first portion; and thereafter, removing the substrate from the chamber and flowing remotely dissociated etchant atoms into the chamber.

2. The method of claim 1 wherein at least one additional portion of the layer is deposited between the first and second portions, said at least one additional portion being deposited after flowing said remotely dissociated etchant atoms into the chamber and before depositing said second portion of said dielectric layer and wherein an additional clean step is performed after said at least one additional portion is deposited and before said second portion is deposited.

3. The method of claim 1 wherein n additional portions of the layer are deposited between the first and second portions, wherein n is a positive integer and said n portions are deposited after flowing said remotely dissociated etchant atoms into the chamber and before depositing said second portion of said dielectric layer and wherein for each additional portion deposited a corresponding clean step is performed after deposition of said additional portion, wherein all of said corresponding clean steps occur before said second portion is deposited.

4. The method of claim 1 wherein said dielectric layer is a conformal silicon oxide layer formed from a TEOS and ozone SACVD deposition process.

5. The method of claim 4 wherein said silicon oxide layer is doped with boron and phosphorus.

6. The method of claim 1 wherein said dielectric layer is deposited over a plurality of stepped surfaces formed on the substrate having gaps formed between adjacent ones of said stepped surfaces and wherein the first portion of said layer partially fills said gaps.

7. The method of claim 6 wherein said second portion of said dielectric layer completes filling said gaps.

8. The method of claim 1 wherein said remotely dissociated etchant atoms are fluorine atoms.

9. The method of claim 8 wherein said fluorine is provided by $NF_3$.

10. A method of cleaning deposits from the interior surfaces of a substrate processing chamber during a process for depositing a dielectric layer over a substrate disposed in the chamber, said method comprising:

flowing TEOS and ozone into the chamber to deposit a first portion of a silicon oxide film over the substrate;

thereafter, stopping the TEOS and ozone flows and initiating a chamber clean operation by flowing remotely dissociated fluorine atoms into the chamber while the substrate is in the chamber;

thereafter, stopping the chamber clean operation by stopping the flow of said remotely dissociated fluorine atoms and flowing ozone and TEOS into the chamber to deposit a second portion of the silicon oxide film on the first portion; and thereafter, stopping the TEOS and ozone flows, removing the substrate from the chamber and restarting the chamber clean operation by flowing remotely dissociated fluorine atoms into the chamber.

11. The method of claim 10 wherein said first and second portions of silicon oxide film are deposited over a plurality of raised features formed on the substrate having gaps formed between adjacent ones of said raised features, the gaps including a lower surface extending between said adjacent raised features and wherein said first portion partially fills said gaps, said initial chamber clean operation etches said first portion in a manner that leaves a continuous layer of said first portion covering said lower surface and wherein said second portion of said dielectric layer completes filling said gaps.

12. The method of claim 10 wherein at least one additional portion of the layer is deposited between the first and second portions, said at least one additional portion being deposited after the first clean operation and wherein an additional clean step is performed after said at least one additional portion is deposited and before said second portion is deposited.

13. The method of claim 10 wherein n additional portions of the layer are deposited between the first and second portions, wherein n is a positive integer and said n portions are deposited after the first clean operation and wherein for each additional portion deposited a corresponding clean step is performed after deposition of said additional portion, wherein all of said corresponding clean steps occur before said second portion is deposited.

14. The method of claim 10 wherein said first and second portions of said silicon oxide film are formed from a SACVD deposition process.

15. The method of claim 14 wherein said silicon oxide layer is doped with boron and phosphorus.

16. A method of depositing a dielectric layer over a substrate disposed in a substrate processing chamber and cleaning deposits from the interior surfaces of the substrate processing chamber, the method comprising:

depositing a first portion of the dielectric layer over the substrate;

stopping deposition of the first portion;

thereafter, keeping the substrate in the substrate processing chamber, flowing a clean gas into a remote plasma chamber fluidly coupled to the substrate processing chamber, generating a first plurality of remotely dissociated etchant atoms in the remote plasma chamber and flowing the first plurality of remotely dissociated etchant atoms into the substrate processing chamber;

thereafter, stopping the flow of the first plurality of remotely dissociated etchant atoms into the substrate processing chamber and subsequently depositing a second portion of the dielectric layer over the first portion; and thereafter, removing the substrate from the substrate processing chamber, flowing the clean gas into the remote plasma chamber, generating a second plurality of remotely dissociated etchant atoms in the remote plasma chamber and flowing the second plurality of remotely dissociated etchant atoms into the substrate processing chamber as part of a chamber clean process.

17. The method of claim 16 wherein the clean gas comprises a fluorine-containing gas.

18. A method of depositing a dielectric layer over a substrate disposed in a substrate processing chamber and cleaning deposits from the interior surfaces of the substrate processing chamber, the method comprising:

depositing a first portion of the dielectric layer over the substrate using a thermal CVD process;

stopping deposition of the first portion;

thereafter, keeping the substrate in the substrate processing chamber, flowing a clean gas into a remote plasma chamber fluidly coupled to the substrate processing chamber, generating a first plurality of remotely dissociated etchant atoms in the remote plasma chamber and flowing the first plurality of remotely dissociated etchant atoms into the substrate processing chamber;

thereafter, stopping the flow of the first plurality of remotely dissociated etchant atoms into the substrate processing chamber and subsequently depositing a second portion of the dielectric layer over the first portion using a thermal CVD process; and thereafter, removing the substrate from the substrate processing chamber, flowing the clean gas into the remote plasma chamber, generating a second plurality of remotely dissociated etchant atoms in the remote plasma chamber and flowing the second plurality of remotely dissociated etchant atoms into the substrate processing chamber as part of a chamber clean process.

19. The method of claim 18 wherein the clean gas comprises a fluorine-containing gas.

* * * * *